United States Patent [19]

Brodie et al.

[11] 4,415,602

[45] Nov. 15, 1983

[54] REACTIVE PLATING METHOD AND PRODUCT

[75] Inventors: Don E. Brodie, St. Agatha, Canada; John H. Morgan, Munich, Fed. Rep. of Germany

[73] Assignee: Canadian Industrial Innovation Centre/Waterloo, Waterloo, Canada

[21] Appl. No.: 365,116

[22] Filed: Apr. 5, 1982

[30] Foreign Application Priority Data

Jul. 24, 1981 [CA] Canada .................................. 382527

[51] Int. Cl.³ .......................... B05D 1/34; B05D 1/36
[52] U.S. Cl. ......................................... 427/39; 427/40
[58] Field of Search ................................. 427/39, 40

[56] References Cited

U.S. PATENT DOCUMENTS

| | | | |
|---|---|---|---|
| 2,501,563 | 3/1950 | Colbert et al. | 117/107 |
| 2,539,149 | 1/1951 | Miller | 117/107 |
| 2,904,452 | 9/1959 | Reichelt | 117/106 |
| 2,996,418 | 8/1961 | Bleil | 154/95 |
| 3,068,510 | 12/1962 | Coleman | 18/2 |
| 3,108,900 | 10/1963 | Papp | 117/93.1 |
| 3,165,405 | 1/1965 | Hoesterey | 96/1 |
| 3,208,873 | 9/1965 | Ames et al. | 117/196 |
| 3,318,790 | 5/1967 | Carbajal et al. | 204/168 |
| 3,473,959 | 10/1969 | Ehinger et al. | 117/201 |
| 3,549,411 | 12/1970 | Bean et al. | 117/69 |
| 3,655,438 | 4/1972 | Sterling et al. | 117/201 |
| 3,788,894 | 1/1974 | Scherber | 117/217 |
| 3,847,658 | 11/1974 | Kumagai | 117/201 |
| 3,900,592 | 8/1975 | Kennedy et al. | 427/39 |

FOREIGN PATENT DOCUMENTS

| | | | |
|---|---|---|---|
| 643527 | 6/1962 | Canada | 117/10 |
| 770566 | 10/1967 | Canada | 117/73 |
| 855193 | 11/1970 | Canada | 204/167 |
| 884480 | 10/1971 | Canada | 204/108 |
| 962225 | 2/1975 | Canada | 204/108 |
| 977306 | 11/1975 | Canada | 204/108 |
| 1006847 | 3/1977 | Canada | 204/167 |
| 1031720 | 5/1978 | Canada | . |

Primary Examiner—James R. Hoffman
Attorney, Agent, or Firm—Moss, Bensette, Thompson, Squires

[57] ABSTRACT

A method is disclosed for the reactive plating of substrates to produce transparent conducting films and photoactive coatings. Reactive gases at low pressures are introduced into a vacuum chamber having a partial vacuum therein. A substrate located in the vacuum chamber is subjected to a glow discharge in the partial vacuum. A coating material, such as zinc or silicon is vaporized in the vacuum chamber to react with the gases, with the resulting compound being deposited on the substrate by the effect of the glow discharge. The power in the glow discharge and the partial pressures of the vaporized coating material and gases introduced into the vacuum chamber can all be controlled separately to vary the stoichiometric ratios and the properties of the coatings. The electrode geometry is arranged and the operation maintained such that the power density distribution in the discharge is fixed and controlled.

26 Claims, 4 Drawing Figures

REACTIVE PLATING METHOD AND PRODUCT

BACKGROUND OF THE INVENTION

This invention relates to the coating or plating of substrates using glow discharge and thermal vaporization in a vacuum chamber.

In the past, various techniques have been used to deposit a film or coating on a substrate located in a vacuum chamber. One technique simply is to thermally vaporize or evaporate a metal, permitting the vapor to condense and be deposited on the substrate. Another method is referred to as chemical vapor deposition wherein different gases are introduced into the vacuum chamber to react and form a compound on the substrate. Yet another prior art method is referred to as sputtering. In this method, a vacuum or gas filled discharge tube has a cathode that is disintegrated by bombardment, so that the cathode material is vaporized and deposited on the substrate.

A variation of these methods is shown in U.S. Pat. No. 2,501,563 issued to W. H. Colbert. In this patent, vacuum evaporation is used to vaporize and deposit a metal substrate. Gas is then introduced into the vacuum chamber to oxidize the metal and form a metallic compound coating. Another variation of the prior art methods is shown in U.S. Pat. No. 3,318,790 issued to B. G. Carbajal III, et al. In this patent, a gaseous organic source material is introduced into a vacuum chamber and a glow discharge is established to polymerize the source material and deposit same on the substrate.

A difficulty with the prior art methods is that they generally do not permit individual and independent control of each parameter of the process and hence do not permit the fabrication of "tailor-made" compounds having predetermined atom ratios and hence predetermined properties.

SUMMARY OF THE INVENTION

In the present invention, a glow discharge in a reacting gas is provided in a vacuum chamber and a coating material is vaporized therein to be deposited on a substrate. Independent adjustment of each of the parameters of the process is possible allowing for control of the reaction and deposition of the coating material, and thus the properties of the film deposited on the substrate.

According to the invention, there is provided a method of coating a substrate comprising the steps of providing a vacuum chamber communicating with a surface of the substrate to be coated. A glow discharge is produced in the vacuum chamber in contact with the substrate surface. Coating material is vaporized in the chamber, and a gas is introduced into the vacuum chamber to react with the vaporized coating material forming a compound to be deposited on the substrate by the glow discharge.

BRIEF DESCRIPTION OF THE DRAWINGS

A preferred embodiment of the invention will now be described, by way of example, with reference to the accompanying drawings, in which.

DETAILED DESCRIPTION OF THE PREFERRED EMBODIMENT

The following description of a preferred embodiment is given in reference to a laboratory test and demonstration unit for carrying out the preferred method to produce the preferred coated substrate. Specific values are given for the various parameters, but it should be emphasized that these values are only exemplary. It will be appreciated that all of the parameters have a range of values as indicated. Further, the ranges of values may vary as the invention is scaled up for commercial production. It is believed, however, that appropriate values for the parameters for apparatus on a larger scale will be readily apparent or perceivable by those skilled in the art.

Figure 1:
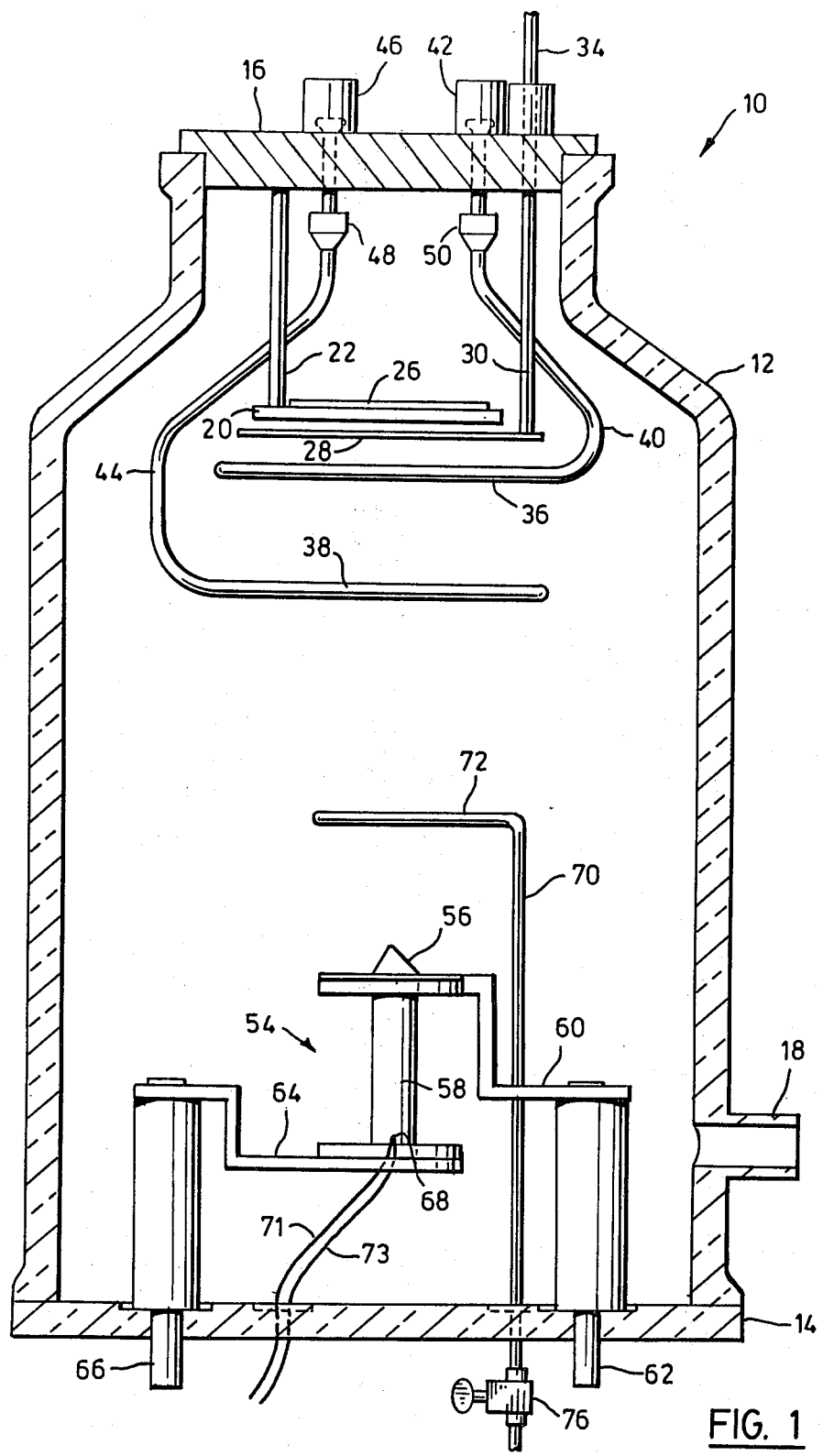
FIG. 1 is a vertical diagrammatic sectional view of a vacuum chamber used to perform the method of the present invention.

Referring to the drawings, a vacuum chamber for carrying out a preferred method of the present invention is generally indicated in FIG. 1 by reference number 10. Vacuum chamber 10 is in the form of a bell jar 12 supported on a base 14. Bell jar 12 has a removable lid 16 which seals the upper opening of the bell jar when the latter is evacuated. Bell jar 12 also has an evacuation port 18 which is connected to a vacuum pump (not shown) for evacuating vacuum chamber 10.

A substrate holder 20 is connected to lid 16 by a support rod 22. Substrate holder 20 is in the form of a loop having a central opening 24 (see FIG. 2). A substrate 26 is shown located on holder 20 over opening 24. In the embodiment shown in the drawings, substrate 26 is a square glass pane approximately 2 inches square. For the purposes of this disclosure, the term substrate includes any object or article which is desired to be coated. The substrate does not have to be flat and the substrate can be made of materials other than glass. In the vacuum chamber shown in the drawings, the underside or lower side of substrate 26 is the surface that is to be coated in vacuum chamber 10.

A screen or shutter 28 is located adjacent to, but spaced closely to the underside of substrate holder 20. Shutter 28 is connected to lid 16 by an upright support rod 30. Support rod 30 is rotatably mounted in lid 16 using a suitable seal 32. Rod 30 has an upper end portion 34 projecting above lid 16. End portion 34 may be rotated to rotate shutter 28 transversely away from substrate 26 when it is desired to commence the coating of the substrate, as described further below.

Figure 2:
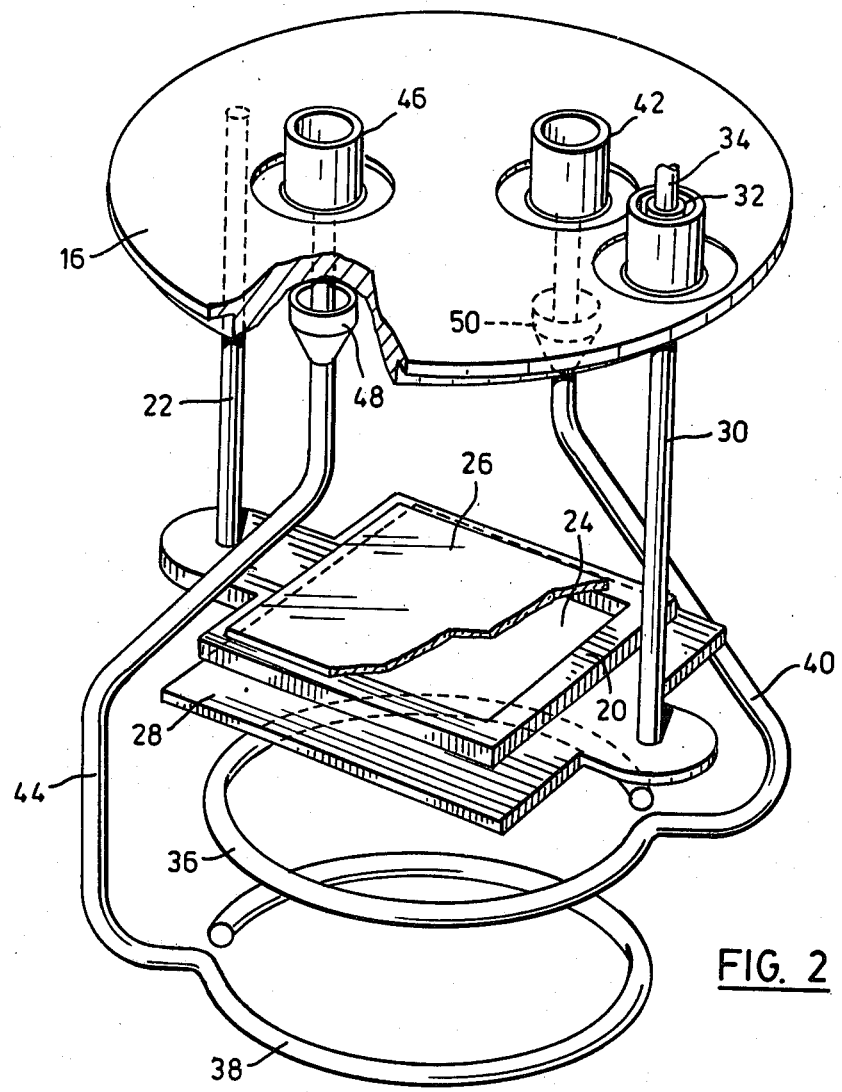
FIG. 2 is a perspective view from above and from the front showing the upper internal components of the vacuum chamber of FIG. 1.

A high voltage electrode forms a cathode 36 in vacuum chamber 10. Another high voltage electrode forms an anode 38. As seen in FIG. 2, cathode 26 is in the form a circular loop spaced below shutter 28, the loop having a diameter slightly larger than substrate holder 20. Cathode 36 includes an upright portion 40 which is electrically connected to a connector 42. Connector 42 provides a seal for lid 16 and permits cathode 36 to be connected to a source of power. Anode 38 also has an upright portion 44 electrically connected to a similar sealing connector 46 for connecting the anode to the source of power. Shields 48, 50 are provided around the upright portions 44, 40 of the respective anode and cathode. Shields 48, 50 are in the form of inverted insulating cups, and they are provided in the event that a conducting film is being deposited on substrate 26.

Without the shields, stray conducting coating material could be deposited on upright portions 44, 46 and the underside of lid 16 causing a short or arcing between the cathode and anode, which is undesirable. Shields 48, 50 also serve to maintain the electrode geometry and enhance the plasma power density when conducting films are deposited.

Figure 4:
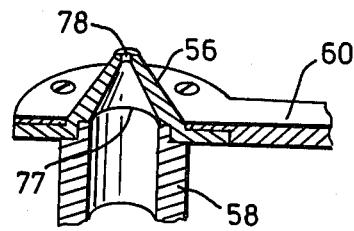
FIG. 4 is a perspective view, partly broken away, taken along lines 4—4 of FIG. 3.
Figure 3:
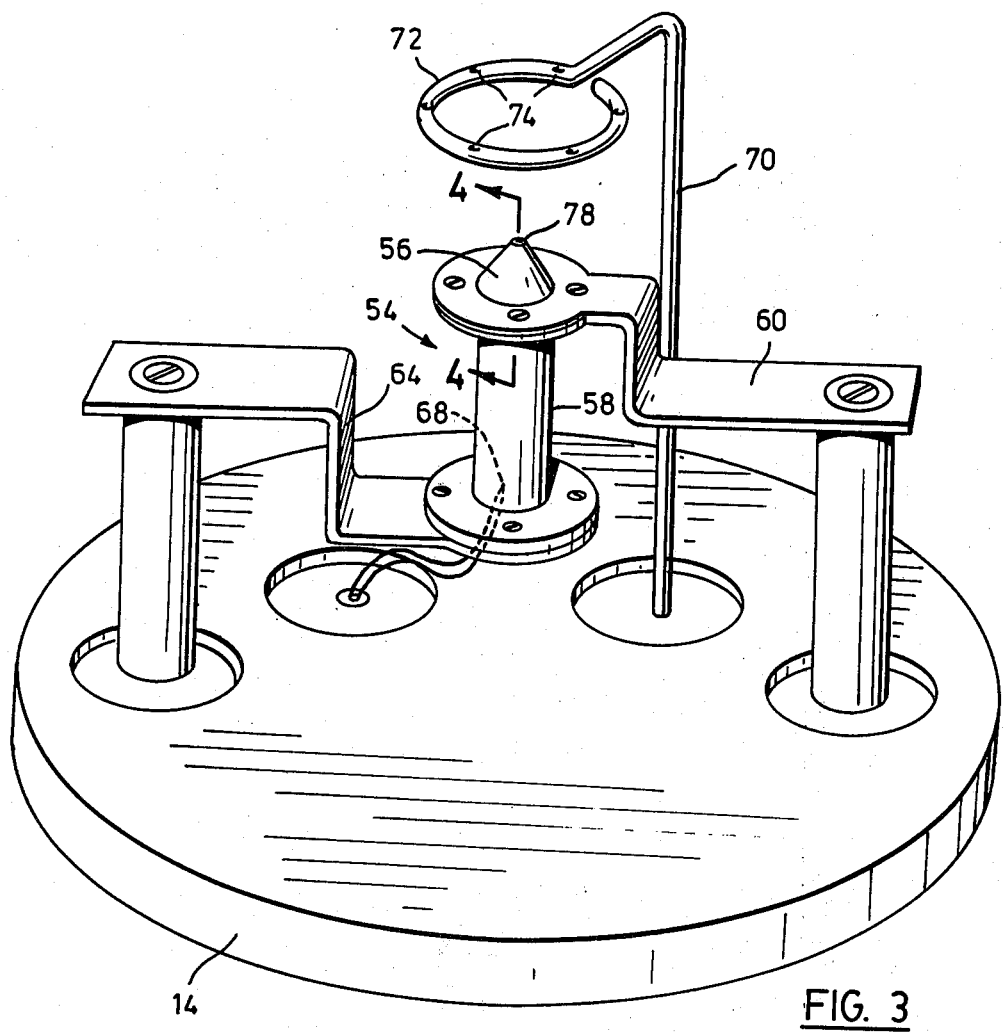
FIG. 3 is a perspective view from above and from the front showing the lower internal components of the vacuum chamber of FIG. 1.

Referring in particular to FIGS. 1, 3 and 4, a coating material source is generally indicated by reference number 54. Source 54 is formed of carbon and has a conical upper portion 56 and a cylindrical lower portion 58. This results in a high resistance joint 77 (see FIG. 4) between upper and lower portions 56, 58, so that electrical current passing therethrough causes heating in the area of joint 77. This heating in the area of joint 77 causes material in source 54 to be heated and vaporized mainly at the top of the material. Conical upper portion 56 has a top orifice 78 typically 0.024 inches in diameter in the laboratory apparatus shown in the drawings. Vapor produced in source 54 emerges through orifice 78 into vacuum chamber 10 as the material in source 54 is heated.

Upper portion 56 is conductibly or electrically connected to an upper element 60, which, in turn, is conductibly connected to a terminal 62 projecting from the underside of base 14. The lower portion 58 of material source 54 is conductibly connected to a lower element 64, which in turn is conductibly connnected to a terminal 66 projecting from the underside of base 14.

Terminals 62, 66 are connected to a suitable source of electrical power to produce the desired heating and vaporization of the material inside source 54.

A thermocouple 68 communicates with the inside of material source 54 for measuring the temperature of the coating material therein. Theremocouple 68 has leads 71, 73 passing through base 14 for connection to a temperature indicating device (not shown).

A gas inlet tube 70 passes through base 14 and has an upper circular loop 72. Loop 72 is formed with a plurality of equally spaced openings 74 through which gas emerges into vacuum chamber 10. Gas inlet tube 70 has a needle valve 76 attached thereto outside vacuum chamber 10 to control the flow of gas passing through tube 70 and entering the vacuum chamber.

The operation of vacuum chamber 10 and the preferred method of the present invention will now be described with reference to the coating of a glass substrate 26 using zinc as the source material and oxygen as the gas inside vacuum chamber 10, to produce a thin, zinc oxide type transparent film on the substrate. Coating material source 54 is filled with zinc metal, and a glass substrate 26 is positioned on substrate holder 20. Shutter 28 is rotated into position so that it is directly beneath substrate 26 to block the substrate and prevent coating material from being deposited on substrate 26 until conditions have reached steady state inside vacuum chamber 10. Evacuation port 18 is connected to a vacuum pump and vacuum chamber 10 is evacuated. Needle valve 76 is opened to allow oxygen to flow through inlet tube 70 and out through loop 72 to fill the vacuum chamber with oxygen. Vacuum chamber 10 is partially evacuated until the oxygen pressure therein is approximately 0.035 torr., and a small amount of oxygen is continuously fed into vacuum chamber 10 to maintain this pressure level.

Cathode 36 and anode 38 are connected to respective negative and positive terminals of a DC power source through connectors 42, 46. Power is applied to the cathode and anode to produce a glow discharge. The power dissipated in the glow discharge is approximately 0.5 watts in the laboratory apparatus shown in the drawings, and this is just above the threshold power required to maintain the glow discharge in the vacuum chamber.

The zince in coating material source 54 is heated by passing a current therethrough; terminals 62 and 66 being connected to a suitable power source for this purpose. The zinc is typically heated to a temperature of about 585 degrees Centigrade in the laboratory apparatus shown, where it is vaporized at the top of coating material source 54. The zinc vapor tus produced in source 54 then passes through orifice 78 in the top of conical upper portion 56 into vacuum chamber 10.

The glow discharge produced between cathode 36 and anode 38 envelops or contacts the underside of substrate 26. Once this glow discharge has been established, and the oxygen pressure is vacuum chamber 10 is at the desired level, and the zinc is being vaporized in coating material source 54, shutter 28 is rotated out of the way. The zinc vapor and oxygen react forming a compound which is deposited on the underside of substrate 26 by the glow discharge. After the compound has been deposited for 50 to 100 seconds, the glow discharge can be turned off and the oxygen and zinc reaction continued. The coating will continue to be deposited on substrate 26 without the glow discharge, and the coating will grow to the thickness desired.

The coating produced as described above is a transparent conducting film having low resistivity, in which the film is $ZnO_x$, wherein x is less than one. Typical properties of this non-stoichiometric transparent conducting film are as follows:

1. 93% light transmission over the visible spectrum with much less than 1% absorption losses
2. $1.3 \times 10^{-3}$ ohm cm. resistivity
3. $10^{20}$ per cm.$^3$ carrier density (electrons)
4. 25 to 35 cm.$^2$/volt-second mobility
5. 4.24 e.v. work function Having described the preferred method of operation to produce transparent high conductivity films, many variations are possible to obtain other properties. For example, in the laboratory test and demonstration unit shown in the drawings, the power in the glow discharge for the entire film deposition process can range from 0.1 watts to 20 watts to produce a very large change in the film resistivity. Different power levels, source temperatures and gas pressures produce films with different opacity and/or different electrical resistivities, which can range from opaque to clear and resistivities differing by as much as eleven orders of magnitude. The glow discharge appears to "clean" the substrate and promote uniform nucleation of the coating thickness. Once a continuous molecular layer of coating compounds is deposited on the substrate, the glow discharge can be turned off and a film will continue to grow uniformly. In fact, with a higher power glow discharge (near 20 watts) operating for about 200 seconds, in the laboratory unit the zinc source can remain cold until after the glow discharge is terminated, and if the zinc source is then heated to vaporize the zinc, a film will be deposited, but it may not have the desired properties.

The amount of zinc being vaporized in coating material source 54 can also be varied by changing the diameter of orifice 78 and by changing the temperature to which the zinc is heated in source 54. The zinc source orifice size and the temperature can also be varied to produce the same rate of vaporization of zinc. For example, orifice 78 could have a diameter of 0.030 inches, and the zinc heated to a temperature of 430 degrees Centigrade or lower, or an orifice diameter of 0.024 inches and a temperature of 585 degrees Centigrade might be used as described above. The higher the zinc temperature, the higher is the zinc partial pressure or the amount of zinc vapor in vacuum chamber 10. Higher temperatures result in a coating compound having a higher percentage of zinc. This would result in a coating or film being deposited on the substrate having an even lower resistivity (at the same $O_2$ pressure), but increased optical absorption. Lowering the zinc partial pressure by decreasing the zinc temperature (again at the same $O_2$ pressure) could produce a zinc oxide compound coating at the stoichiometric ratio, and this would have a very high resistivity. Normal operating temperatures for a zinc source orifice size of 0.024 inches are between 550 and 600 degrees Centigrade.

The oxygen gas pressure inside vacuum chamber 10 can also be varied independently. For a fixed glow discharge power and source temperature, the range can be between 0.010 and 0.070 torr.. Higher oxygen pressures result in coatings having higher resistivity and lower opacity, and vice versa. Increasing the amount or pressure of the oxygen causes the coated film to approach the stoichiometric ratio of zinc oxide and high resistivity films, but for low resistivity, a non-stoichiometric compound should be deposited on the substrate. It will be appreciated that the stoichiometric ratio of the coating can be varied by changing either the rate of vaporization of the zinc or the oxygen pressure, so stoichiometric coatings can be produced by increasing the oxygen pressure.

Other materials and gases could also be used with the method of this invention. For example, silicon can be vaporized in coating material source 54, and hydrogen can be introduced into the vacuum chamber through gas inlet tube 70. In this case, the glow discharge must be operating for the entire deposition process. This produces hydrogenated silicon. Other gases, such as nitrogen, fluorine and oxygen, and mixtures of same such as nitrogen and oxygen, could also be used with silicon to produce correspondingly similar types of coatings.

The method as described above could be adapted to a continuous process wherein the substrate passes through a vacuum chamber, or a vacuum chamber passes over the substrate. It will be appreciated that forms of vacuum chambers can be used other than the bell jar type container described above. The polarity of the electrodes forming the glow discharge can be reversed, and in fact, alternating current can be used to produce the glow discharge. It is preferred to have the dimensions of the cathode and anode comparable to the substrate size and the cathode spaced about 1 cm. from the substrate, but this can be varied. However, the film uniformity and the rate of deposition would change. The term "transparent" as used in association with the zinc and oxygen coating described above refers to the visible spectrum only, and the degree of transparency is dependent upon the opacity or stoichiometric ratio of the compound deposited on the substrate.

From the above, it will be appreciated that the present invention provides a very flexible method of coating substrates wherein the properties of the coatings can be changed as desired by varying the three parameters involved, namely, the glow discharge power, the vaporization rate of the coating material, and the reactive gas pressure in the vacuum chamber.

These parameters are interrelated but can be controlled and adjusted separately. For example, in the case of $ZnO_x$, the three parameters, discharge power density, Zn partial pressure, and oxygen gas pressure can be varied to produce a range of properties from good conductivity and good transparency to high resistivity and good transparency by adjusting one, two or all three of these parameters. Any given set of parameters is not necessarily unique, since for example, an increase in the gas pressure can be offset by an appropriate change in the Zn partial pressure, and an appropriate change in the discharge power density to achieve films with similar properties.

The parameters can be changed even during the coating process to produce a coating with varying properties across the coating thickness. For example, the index of refraction can be varied from 2.3 to 1.8 for $ZnO_x$, or a non-stoichiometric zinc and oxygen coating can be produced by this method having very low resistivity and high visible light transmission characteristics. In fact, the resistivity of this coating can be varied between $6 \times 10^{-4}$ and $10^8$ ohm cm.

What we claim as our invention is:

1. A method of coating a substrate comprising:
   providing a vacuum chamber communicating with a surface of the substrate to be coated;
   producing a glow discharge in the vacuum chamber in contact with said substrate surface;
   vaporizing coating material in said chamber; and
   introducing a gas into the vacuum chamber to react with said vaporized coating material forming a compound to be deposited on the substrate by the glow discharge.

2. A method of coating a substrate as claimed in claim 1 wherein the production of the glow discharge, the vaporization of the coating material and the introduction of the gas are all done simultaneously.

3. A method of coating a substrate as claimed in claim 2 and further comprising the step of terminating the glow discharge after at least a continuous molecular layer of coating compound has been coated on the substrate.

4. A method of coating a substrate as claimed in claim 3 wherein the glow discharge is produced having a discharge power just above the threshold power required to maintain the discharge in the vacuum chamber.

5. A method of coating a substrate as claimed in claim 3 wherein the gas is introduced at a constant rate and the coating material is vaporized at a rate such that its reaction with the gas produces a non-stoichiometric compound being deposited on the substrate.

6. A method of coating a substrate as claimed in claim 3 wherein the coating material is vaporized at a constant rate and the gas is introduced at a rate such that its reaction with the vaporized coating material produces a non-stiochiometric compound being deposited on the substrate.

7. A method of coating a substrate as claimed in claim 1 wherein the production of the glow discharge and the introduction of the gas are done before the coating material is vaporized.

8. A method of coating a substrate as claimed in claim 7 and further comprising the step of terminating the glow discharge after the introduction of the gas and during the vaporization of the coating material.

9. A method of coating a substrate as claimed in claim 7 wherein the glow discharge is produced having a discharge power just above the threshold power required to maintain the discharge in the vacuum chamber.

10. A method of coating a substrate as claimed in claim 7 wherein the gas is introduced at a constant rate and the coating material is vaporized at a rate such that its reaction with the gas produces a non-stoichiometric compound being deposited on the substrate.

11. A method of coating a substrate as claimed in claim 7 wherein the coating material is vaporized at a constant rate and the gas is introduced at a rate such that its reaction with the vaporized coating material produces a non-stoichiometric compound being deposited on the substrate.

12. A method of coating a substrate as claimed in claim 1 wherein the glow discharge is produced having a discharge power just above the threshold power required to maintain the discharge in the vacuum chamber.

13. A method of coating a substrate as claimed in claim 1 wherein the gas is introduced at a constant rate and the coating material is vaporized at a rate such that its reaction with the gas produces a non-stoichiometric compound being deposited on the substrate.

14. A method of coating a substrate as claimed in claim 1 wherein the coating material is vaporized at a constant rate and the gas is introduced at a rate such that its reaction with the vaporized coating material produces a non-stoichiometric compound being deposited on the substrate.

15. A method of coating a substrate as claimed in claim 1 wherein the coating material is zinc and the gas is oxygen.

16. A method of coating a substrate as claimed in claim 15 wherein the zinc is vaporized by providing a heated zinc source having a discharge orifice between 0.024 and 0.030 inches in diameter, the zinc being heated between 430 degrees Centigrade and 600 degrees Centigrade.

17. A method of coating a substrate as claimed in claim 15 wherein the zinc is vaporized by providing a heated zinc source having a discharge orifice of 0.024 inches in diameter, the zinc being heated between 550 and 600 degrees Centigrade.

18. A method of coating a substrate as claimed in claim 15 wherein the oxygen is introduced into the vacuum chamber and the chamber is evacuated to produce an oxygen pressure between 0.010 and 0.070 torr. in the vacuum chamber.

19. A method of coating a substrate as claimed in claim 15 wherein the oxygen is introduced into the vacuum chamber and the chamber is evacuated to produce an oxygen pressure between 0.035 and 0.055 torr.

20. A method of coating a substrate as claimed in claim 15 wherein the glow discharge is produced having a discharge power between 0.1 watts and 20 watts.

21. A method of coating a substrate as claimed in claim 20 wherein the glow discharge power is substantially 0.5 watts.

22. A method of coating a substrate as claimed in claim 15 wherein the zinc is vaporized by providing a heated zinc source having a discharge orifice of 0.024 inches, the zinc being heated to 585 degrees Centigrade, wherein the oxygen is introduced into the vacuum chamber and the chamber is evacuated to produce an oxygen pressure. substantially about 0.050 torr., and wherein the glow discharge power is 0.5 watts.

23. A method of coating a substrate as claimed in claim 1 wherein the coating material is silicon and the gas is hydrogen.

24. A method of coating a substrate as claimed in claim 1 wherein the coating material is silicon and the gas is nitrogen.

25. A method of coating a substrate as claimed in claim 1 wherein the coating material is silicon and the gas is oxygen.

26. A method of coating a substrate as claimed in claim 1 wherein the coating material is silicon and the gas is a mixture of nitrogen and oxygen.

* * * * *